United States Patent
Okuno et al.

(10) Patent No.: US 8,420,425 B2
(45) Date of Patent: Apr. 16, 2013

(54) METHOD FOR PRODUCING A GROUP III NITRIDE SEMICONDUCTOR LIGHT-EMITTING DEVICE

(75) Inventors: Koji Okuno, Kiyosu (JP); Atsushi Miyazaki, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/481,386

(22) Filed: May 25, 2012

(65) Prior Publication Data

US 2012/0309124 A1 Dec. 6, 2012

(30) Foreign Application Priority Data

May 30, 2011 (JP) ................................. 2011-120959

(51) Int. Cl.
*H01L 21/00* (2006.01)

(52) U.S. Cl.
USPC .................. 438/46; 438/47; 257/E33.027

(58) Field of Classification Search ............ 257/E33.027
See application file for complete search history.

(56) References Cited

U.S. PATENT DOCUMENTS

| 7,589,346 | B2 | 9/2009 | Biwa et al. | |
|---|---|---|---|---|
| 2006/0237733 | A1* | 10/2006 | Yamada | 257/97 |
| 2008/0265275 | A1* | 10/2008 | Hanamaki et al. | 257/103 |
| 2009/0072267 | A1* | 3/2009 | Goshonoo et al. | 257/103 |
| 2009/0206325 | A1 | 8/2009 | Biwa et al. | |
| 2009/0242874 | A1 | 10/2009 | Biwa et al. | |
| 2010/0078660 | A1* | 4/2010 | Moriyama et al. | 257/94 |

FOREIGN PATENT DOCUMENTS

| JP | 2005-051170 A | 2/2005 |
|---|---|---|
| JP | 2007-080996 A | 3/2007 |

* cited by examiner

*Primary Examiner* — Thien F Tran
(74) *Attorney, Agent, or Firm* — McGinn IP Law Group, PLLC

(57) ABSTRACT

The present invention provides a method for producing a Group III nitride semiconductor light-emitting device whose driving voltage is reduced. In the production method, a p cladding layer has a superlattice structure in which a p-AlGaN layer having a thickness of 0.5 nm to 10 nm and an InGaN layer are alternately deposited. A growth temperature of the p-AlGaN layer is 800° C. to 950° C. The InGaN layer having a thickness of one to two monolayers is formed on the p-AlGaN layer, by stopping the supply of TMA, introducing TMI, and increasing the supply amount of Ga source gas while maintaining the p-AlGaN layer at the growth temperature. Thus, the thickness of the p cladding layer can be reduced while maintaining good crystal quality, thereby reducing the driving voltage.

12 Claims, 3 Drawing Sheets

METHOD FOR PRODUCING A GROUP III NITRIDE SEMICONDUCTOR LIGHT-EMITTING DEVICE

FIELD OF THE INVENTION

The present invention relates to a method for producing a Group III nitride semiconductor light-emitting device, and more particularly, to a method for forming a p cladding layer.

BACKGROUND ART

Conventionally, a p cladding layer is provided to improve emission performance by confining electrons in a light-emitting layer of a Group III nitride semiconductor light-emitting device. To enhance the effect of electron confinement, p-AlGaN having large bandgap energy is used as a p cladding layer. However, p-AlGaN needs to be grown at a low temperature to reduce thermal damage to the light-emitting layer, resulting in degradation of crystal quality. Therefore, a p-AlGaN/p-InGaN or p-AlGaN/p-GaN superlattice structure is used to suppress degradation of crystal quality. A p-AlGaN/p-InGaN superlattice structure is more preferable because p-InGaN exhibits superior crystal quality at a low growth temperature as compared with p-GaN.

Japanese Patent Application Laid-Open (kokai) No. 2005-51170 discloses that a superlattice structure in which p-AlGaN and p-InGaN are alternately deposited is used as a p cladding layer. It is also disclosed that p-AlGaN has a thickness of 1 nm to 5 nm and p-InGaN has a thickness of 1 nm to 5 nm.

Japanese Patent Application Laid-Open (kokai) No. 2007-80996 discloses that a superlattice structure in which p-AlGaN and p-GaN are alternately deposited is used as a p cladding layer. It is also disclosed that each of p-AlGaN and p-GaN has a thickness of at least one atomic layer.

However, when a p-AlGaN/p-InGaN or p-AlGaN/p-GaN superlattice structure is used as a p cladding layer, the overall thickness of the p cladding layer increases due to the presence of p-InGaN or p-GaN which does not contribute to electron confinement. This leads to a problem that the series resistance increases and the driving voltage increases.

SUMMARY OF THE INVENTION

In view of the foregoing, an object of the present invention is to provide a method for producing a Group III nitride semiconductor light-emitting device without increasing the driving voltage.

In a first aspect of the present invention, there is provided a method for producing a Group III nitride semiconductor light-emitting device having a p cladding layer. The method comprises forming a p cladding layer by repeatedly growing a p-AlGaN layer having a thickness of 0.5 nm to 10 nm and an InGaN layer by MOCVD, wherein the InGaN layer having a thickness of one to two monolayer is formed on the p-AlGaN layer by stopping the supply of an Al source gas, introducing an In source gas, and increasing the supply amount of a Ga source gas while maintaining the p-AlGaN layer at a growth temperature.

In a fifth aspect of the present invention, there is provided a method for producing a Group III nitride semiconductor light-emitting device having a p cladding layer. The method comprises forming a p cladding layer by repeating a first process of growing a p-AlGaN layer having a thickness of 0.5 nm to 10 nm and a second process of exposing a surface of the p-AlGaN layer to gases for growing InGaN by stopping the supply of an Al source gas, introducing an In source gas, and increasing the supply amount of a Ga source gas while maintaining the p-AlGaN layer at a growth temperature.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 (Group IIIB) element (i.e., B or Tl), or a portion of N is substituted by another Group 15 (Group VB) element (i.e., P, As, Sb, or Bi). Specific examples of the Group III nitride semiconductor include those containing at least Ga, such as GaN, InGaN, AlGaN, and AlGaInN. When forming a Group III nitride semiconductor, for example, TMA (trimethylaluminum) is supplied as an Al source, and TMI (trimethylindium) is used as an In source, TMG (trimethylgallium) is used as a Ga source.

The thickness of one monolayer (or monomolecular layer, hereinafter the term of monolayer is used) of p-InGaN is half the lattice constant of c axis of p-InGaN, i.e., about 2.5 Å to 2.6 Å, depending on the In composition ratio.

The reason why the p-AlGaN layer has a thickness of 0.5 nm to 10 nm is as follows: when the thickness is smaller than 0.5 nm, the function as a p cladding layer, that is, the effect of electron confinement is degraded, which is not desirable. When the thickness is larger than 10 nm, the crystal quality of the p-AlGaN layer is degraded. More preferably, the p-AlGaN layer has a thickness of 1 nm to 5 nm, and further preferably, 1.5 nm to 3.5 nm.

Preferably, the p-AlGaN layer and the InGaN layer are grown at a temperature of 800° C. to 950° C. When the growth temperature is within this range, the crystal quality of the p-AlGaN layer can be significantly improved by exposing the surface of the p-AlGaN layer to the gases for forming InGaN. The growth temperature is more preferably, 830° C. to 920° C., and further preferably, 850° C. to 900° C.

Preferably, the p-AlGaN layer has an Al composition ratio x of 15 mol % to 50 mol % when the p-AlGaN is defined as $p\text{-}Al_xGa_{1-x}N$. That is x is ratio of number of moles of Al to number of moles of Al and Ga. When the Al composition ratio is within this range, the effect of electron confinement by the p cladding layer can be significantly enhanced. The Al composition ratio x is more preferably, 20 mol % to 40 mol %, and further preferably, 25 mol % to 35 mol %.

Moreover, in the first aspect of the present invention, the InGaN layer preferably has an In composition ratio y of 2 mol % to 10 mol % when the InGaN is defined as $In_yGa_{1-y}N$. That is y is ratio of number of moles of In to number of moles of In and Ga. When the In composition ratio is within this range, the crystal quality of the p-AlGaN layer can be further improved by the InGaN layer. The In composition ratio y is more preferably, 4 mol % to 8 mol %, and further preferably, 6 mol % to 8 mol %. Further, a part or whole of the InGaN layer may be lost due to evaporation during switching to the gases for growing the p-AlGaN layer or at the initial growth stage of the p-AlGaN layer. The InGaN layer may be a p-InGaN layer doped with Mg.

A second aspect of the present invention is drawn to a specific embodiment of the production method according to the first aspect, wherein the growth temperature of the p-AlGaN layer is 800° C. to 950° C.

A third aspect of the present invention is drawn to a specific embodiment of the production method according to the first or second aspect, wherein the p-AlGaN layer has an Al composition ratio x of 15 mol % to 50 mol %.

A fourth aspect of the present invention is drawn to a specific embodiment of the production method according to any of the first to third aspects, wherein the InGaN layer has an In composition ratio y of 2 mol % to 10 mol %.

A sixth aspect of the present invention is drawn to a specific embodiment of the production method according to the fifth aspect, wherein the p-AlGaN layer is grown at a temperature of 800° C. to 950° C.

A seventh aspect of the present invention is drawn to a specific embodiment of the production method according to the fifth or sixth aspect, wherein the p-AlGaN layer has an Al composition ratio x of 15 mol % to 50 mol %.

In the first aspect of the present invention, the thickness of the InGaN layer which does not contribute to electron confinement is reduced to one to two monolayers. Thus, the crystal quality of the p-AlGaN layer is improved and the series resistance can be reduced, resulting in the reduction of the driving voltage.

Moreover, the InGaN layer is grown at the same temperature as that of the p-AlGaN layer, and the supply amount of a Ga source gas when forming the InGaN layer is increased as compared with when forming the p-AlGaN layer. Thereby, the crystal quality of the p-AlGaN layer can be further improved by the InGaN layer.

In the fifth aspect of the present invention, the crystal quality of p-AlGaN can be improved by repeatedly exposing the surface of the p-AlGaN layer to the gases for forming InGaN although InGaN is not formed on the p-AlGaN layer. Since InGaN is not formed, the series resistance can be reduced, resulting in the reduction of the driving voltage.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
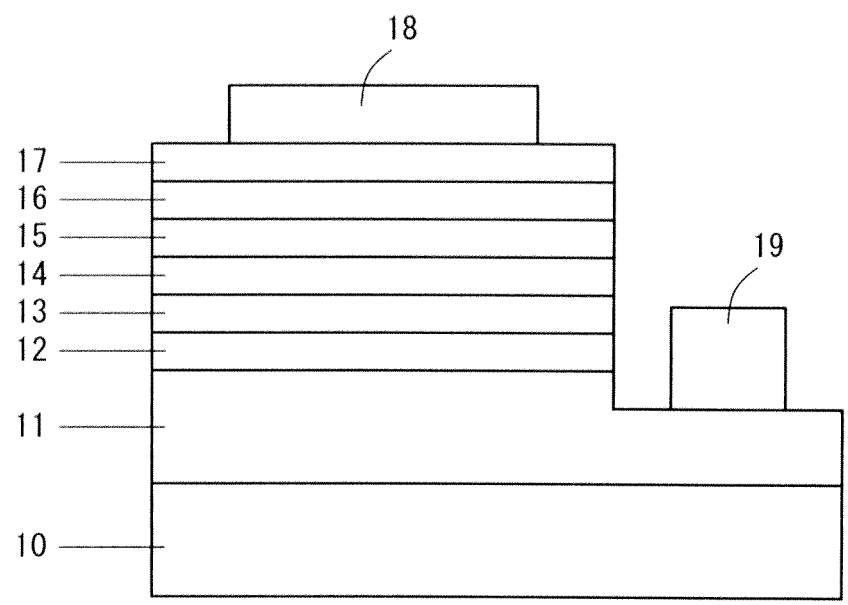
FIG. 1 shows the configuration of a Group III nitride semiconductor light-emitting device according to Embodiment 1.

FIG. 1 shows the configuration of a Group III nitride semiconductor light-emitting device according to Embodiment 1. As shown in FIG. 1, the Group III nitride semiconductor light-emitting device according to Embodiment 1 includes a sapphire substrate 10; and an n contact layer 11, an nESD layer 12, an n cladding layer 13, a light-emitting layer 14, a p cladding layer 15, and a p contact layer 16, each of the layers being formed of Group III nitride semiconductor, are sequentially deposited on the substrate 10 via a low temperature buffer layer (not illustrated). A trench having a depth extending from the top surface of the p contact layer 16 to the n contact layer 11 is formed in a portion of the top surface of the p contact layer 16. An n-electrode 19 is formed on the surface of the n-contact layer exposed at the bottom of the trench. An ITO transparent electrode 17 is formed on a portion of the p contact layer 16 which has no trench, and a p-electrode 18 is formed on the transparent electrode 17.

Figure 2:
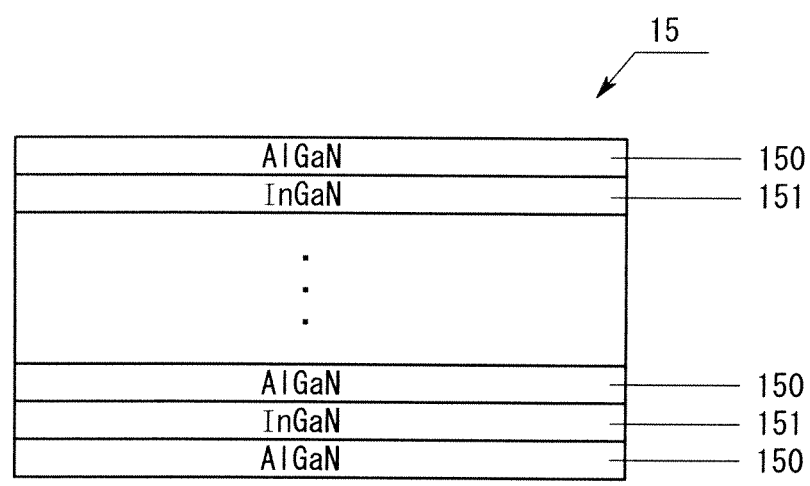
FIG. 2 shows the structure of a p cladding layer 15.

The p cladding layer 15 has a superlattice structure formed of layer units, each including a p-AlGaN layer 150 and a p-InGaN layer 151, which are alternately deposited, as shown in FIG. 2. The number of layer units is 5 to 15. The p-AlGaN layer 150 has a thickness of 0.5 nm to 10 nm, an Al composition ratio of 15 mol % to 50 mol %, and a Mg concentration of $1\times10^{19}/cm^3$ to $5\times10^{20}/cm^3$. The p-InGaN layer 151 has a thickness of one to two monolayer, an In composition ratio of 2 mol % to 10 mol %, and a Mg concentration of $1\times10^{19}/cm^3$ to $2\times10^{20}/cm^3$. The thickness of one monolayer of InGaN is half the lattice constant of c axis of InGaN, i.e., about 2.5 Å to 2.6 Å, depending on the In composition ratio. The overall thickness of the p cladding layer 15 is 10 nm to 90 nm.

Layers other than the p cladding layer 15 may have any conventionally known structure. For example, the n contact layer 11 being formed of n-GaN, may comprise a plurality of layers having different Si contents. The nESD layer 12 has a two-layer structure including an i-GaN layer and an n-GaN layer. The n cladding layer 13 has a superlattice structure in which i-GaN and i-InGaN are alternately and repeatedly formed. The light-emitting layer 14 has a MQW structure in which an undoped InGaN well layer and an undoped GaN barrier layer are alternately deposited three times. The p contact layer 16 being formed of p-GaN, may comprise a plurality of layers having different Mg contents.

Next will be described a process for producing the Group III nitride semiconductor light-emitting device according to Embodiment 1 with reference to FIG. 3.

The p-type Group III nitride semiconductor is actually produced by heat treatment of Mg doped Group III nitride semiconductor in the subsequent process. However, hereinafter, for simplification, it is referred to as p-AlGaN or p-InGaN even before heat treatment.

Firstly, the sapphire substrate 10 on the surface of which the concave and convex are formed is placed in an MOCVD apparatus, and heated in a hydrogen atmosphere for thermal cleaning.

Figure 3A:
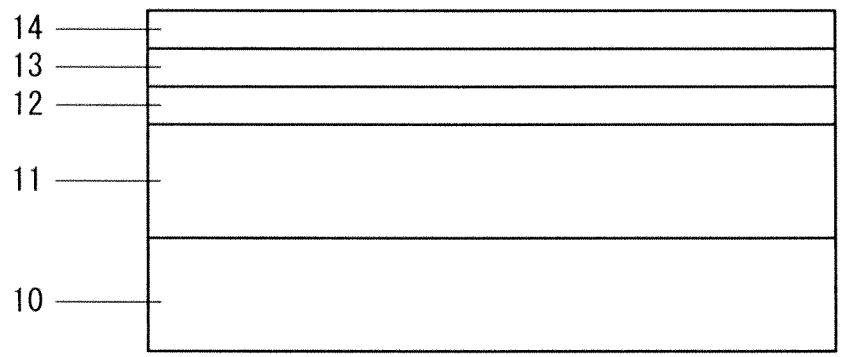
FIGS. 3A, 3B, and 3C show the process for producing the Group III nitride semiconductor light-emitting device according to Embodiment 1.

Next, a low temperature buffer layer (not illustrated) is formed on the sapphire substrate 10. An n contact layer 11, an nESD layer 12, an n cladding layer 13, and a light-emitting layer 14 are sequentially formed on the low temperature buffer layer by MOCVD (FIG. 3A). The gases employed are as follows: hydrogen or nitrogen as a carrier gas; ammonia gas as a nitrogen source; TMG (trimethylgallium) as a Ga source; TMA (trimethylaluminum) as an Al source; TMI (trimethylindium) as an In source; and silane ($SiH_4$) as an n-type dopant gas.

Subsequently, a p cladding layer 15 is formed through the following processes.

Firstly, on the light-emitting layer 14 is formed, by MOCVD, a p-AlGaN layer 150 having a thickness of 0.5 nm to 10 nm, an Al composition ratio of 15 mol % to 50 mol %, and a Mg concentration of $1\times10^{19}/cm^3$ to $5\times10^{20}/cm^3$. The same carrier gas and raw material gases as mentioned above are employed. Biscyclopentadienylmagnesium ($Mg(C_5H_5)_2$) is used as a p-type dopant gas. The growth temperature is 800° C. to 950° C.

Subsequently, while the temperature is maintained at the growth temperature, the supply of TMA is stopped, TMI is introduced and the supply amount of TMG is increased. Thus, on the p-AlGaN layer 150 is formed, a p-InGaN layer 151 having a thickness of one to two monolayer, an In composition ratio of 2 mol % to 10 mol %, and an Mg concentration of $1 \times 10^{19}/cm^3$ to $2 \times 10^{20}/cm^3$.

Figure 3B:
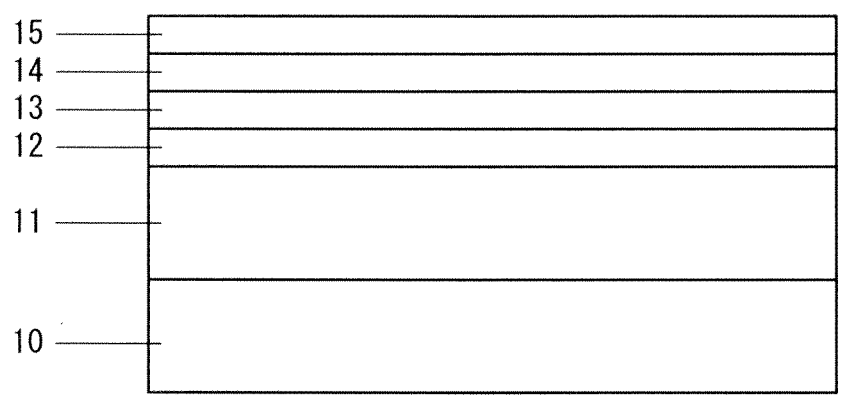

A p cladding layer 15 having a p-AlGaN/p-InGaN superlattice structure is formed by alternately repeating the process of forming the p-AlGaN layer 150 and the process of forming the p-InGaN layer 151 five to fifteen times so that these layers are alternately deposited (FIG. 3B). A part or whole of the p-InGaN layer 151 may be lost due to evaporation during switching to the gases for forming the p-AlGaN layer 150 on the p-InGaN layer 151, or at the initial growth stage of the p-AGaN layer 150.

The reason that the p-AlGaN layer 150 is grown at a low temperature of 800° C. to 950° C. in forming the p cladding layer 15 is to reduce thermal damage to the light-emitting layer 14. However, when the p-AlGaN layer 150 is grown at a low temperature, the growth is more promoted in the longitudinal direction than in the lateral direction. The layer surface is easily roughened, resulting in degradation of crystal quality. Therefore, the p-InGaN layer 151 exhibiting enhanced growth in the lateral direction and good crystal quality even at a low temperature is used to form a superlattice structure. Moreover, the p-AlGaN layer 150 has a thickness of 0.5 nm to 10 nm to suppress degradation of crystallinity. The p-InGaN layer 151 has a thickness of one to two monolayer to minimize the thickness of the p-InGaN layer 151 which does not function as a cladding layer serving to confine electrons in the light-emitting layer 14. The supply amount of TMG as a Ga source is increased in forming the p-InGaN layer 151, thereby preventing evaporation of In and further improving the crystal quality of the p-AlGaN layer 150 by the p-InGaN layer 151. Thus, while maintaining good crystal quality of the p-AlGaN layer 150, the p-InGaN layer 151 is thinned, and the overall thickness of the p cladding layer 15 is reduced. As a result, the series resistance of the p cladding layer 15 is reduced, thereby reducing the driving voltage of the Group III nitride semiconductor light-emitting device.

The p-AlGaN layer 150 has more preferably a thickness of 1 nm to 5 nm to enhance the function as a cladding layer and the crystal quality. Further preferably, the thickness is 1.5 nm to 3.5 nm.

More preferably, the p-AlGaN layer 150 has an Al composition ratio of 20 mol % to 40 mol % to enhance the function as a cladding layer. Further preferably, the Al composition ratio is 25 mol % to 35 mol %.

More preferably, the p-InGaN layer 151 has an In composition ratio of 4 mol % to 8 mol % to enhance the crystal quality of the p-AlGaN layer 150 by the p-InGaN layer 151. Further preferably, the In composition ratio is 6 mol % to 8 mol %. The p-InGaN layer 151 may be replaced with the InGaN layer which is undoped with the p-type dopant.

The p-AlGaN layer 150 and the p-InGaN layer 151 are more preferably grown at a temperature of 830° C. to 920° C. to enhance the crystal quality of the p-AlGaN layer 150 by the p-InGaN layer 151. Further preferably, the growth temperature is 850° C. to 900° C.

Figure 3C:
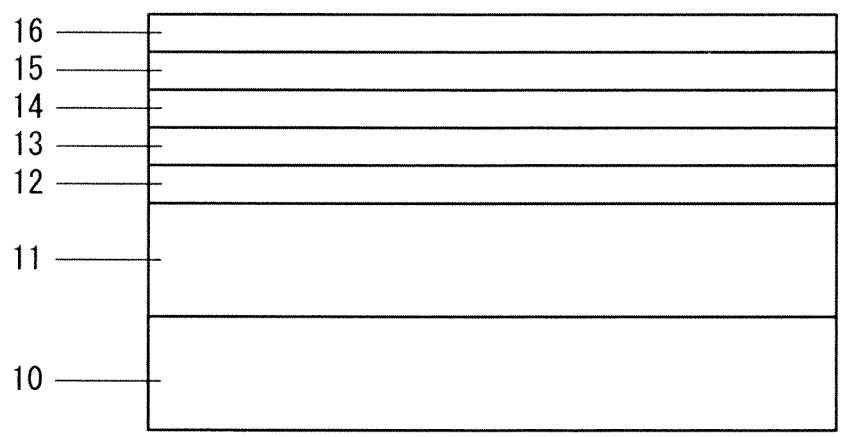

Next, on the p cladding layer 15, a p contact layer 16 is formed by MOCVD (FIG. 3C). The same raw material gases, carrier gas, and doping gas are employed as those when the p cladding layer 15 was formed. A transparent electrode 17 is formed in a portion of the p contact layer 16. A trench having a depth reaching the n contact layer 11 is formed in a portion other than the transparent electrode 17 of the surface of the p contact layer 16. An n-electrode 19 is formed at the bottom of the trench, and a p-electrode 18 is formed on the transparent electrode 17. Through the above, the Group III nitride semiconductor light-emitting device according to Embodiment 1 as shown in FIG. 1 was produced.

Embodiment 2

In a method for producing a Group III nitride semiconductor light-emitting device according to Embodiment 2, the process of forming a p cladding layer 15 in the method for producing a Group III nitride semiconductor light-emitting device according to Embodiment 1 is replaced with the process of forming a p cladding layer 25 described below.

Figure 4A:
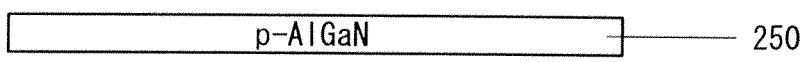
FIGS. 4A, 4B, and 4C show the process for producing a p cladding layer 25 according to Embodiment 2.

Firstly, on the light-emitting layer 14 is formed, by MOCVD, a p-AlGaN layer 250 having a thickness of 0.5 nm to 10 nm, an Al composition ratio of 15 mol % to 50 mol %, and a Mg concentration of $1 \times 10^{19}/cm^3$ to $5 \times 10^{20}/cm^3$ (FIG. 4A). The growth temperature is 800° C. to 950° C.

Figure 4B:
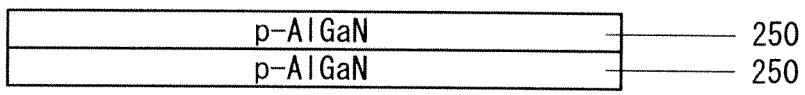

Subsequently, while maintaining the temperature at the growth temperature, the supply of TMA is stopped, TMI is introduced and the supply amount of TMG is increased. Thus, the surface of the p-AlGaN layer 250 is exposed to the gases for forming InGaN. This process is finished before InGaN is formed on the p-AlGaN layer 250, and the process of forming the p-AlGaN layer 250 is performed again (FIG. 4B).

Figure 4C:
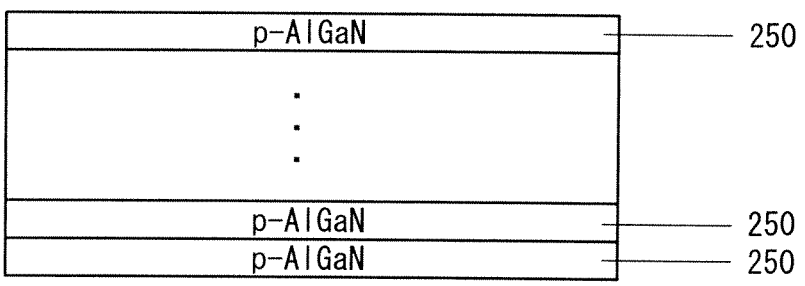

The process of forming the p-AlGaN layer 250 and the process of exposing the surface of the p-AlGaN layer 250 to the gases for forming InGaN are alternately repeated five to fifteen times to form a p cladding layer 25 as shown in FIG. 4C.

The above mentioned process of forming the p cladding layer 25 can suppress degradation of crystallinity because the surface of the p-AlGaN layer 250 is recovered by exposure to the gases for forming InGaN. While maintaining good crystal quality of the p-AlGaN layer 250, the overall thickness of the p cladding layer 25 is reduced because InGaN is not formed. As a result, the series resistance of the p cladding layer 25 is reduced, thereby reducing the driving voltage of the Group III nitride semiconductor light-emitting device.

Although the Group III nitride semiconductor light-emitting device according to Embodiments 1 and 2 have a face-up-type structure, the light-emitting device of the present invention may have a flip-chip-type structure.

The Group III nitride semiconductor light-emitting device produced by the method of the present invention can be employed as a light source of an illumination apparatus, or a display apparatus.

What is claimed is:

1. A method for producing a Group III nitride semiconductor light-emitting device having a p cladding layer, the method comprising:
    forming the p cladding layer by repeatedly growing a p-AlGaN layer having a thickness of 0.5 nm to 10 nm and an InGaN layer by MOCVD, wherein the InGaN layer having a thickness of one to two monolayer is formed on the p-AlGaN layer by stopping the supply of an Al source gas, introducing an In source gas, and increasing the supply amount of a Ga source gas while maintaining the p-AlGaN layer at a growth temperature.

2. A method for producing a Group III nitride semiconductor light-emitting device according to claim 1, wherein the InGaN layer has an In composition ratio y of 2 mol % to 10 mol % when the InGaN is defined as $In_yGa_{1-y}N$.

3. A method for producing a Group III nitride semiconductor light-emitting device according to claim 1, wherein the p-AlGaN layer has an Al composition ratio x of 15 mol % to 50 mol % when the p-AlGaN is defined as $p-Al_xGa_{1-x}N$.

4. A method for producing a Group III nitride semiconductor light-emitting device according to claim 3, wherein the InGaN layer has an In composition ratio y of 2 mol % to 10 mol % when the InGaN is defined as $In_yGa_{1-y}N$.

5. A method for producing a Group III nitride semiconductor light-emitting device according to claim 1, wherein a growth temperature of the p-AlGaN layer is 800° C. to 950° C.

6. A method for producing a Group III nitride semiconductor light-emitting device according to claim 5, wherein the InGaN layer has an In composition ratio y of 2 mol % to 10 mol % when the InGaN is defined as $In_yGa_{1-y}N$.

7. A method for producing a Group III nitride semiconductor light-emitting device according to claim 5, wherein the p-AlGaN layer has an Al composition ratio x of 15 mol % to 50 mol % when the p-AlGaN is defined as $p-Al_xGa_{1-x}N$.

8. A method for producing a Group III nitride semiconductor light-emitting device according to claim 7, wherein the InGaN layer has an In composition ratio y of 2 mol % to 10 mol % when the InGaN is defined as $In_yG_{1-y}N$.

9. A method for producing a Group III nitride semiconductor light-emitting device having a p cladding layer, the method comprising:

a first process of growing a p-AlGaN layer having a thickness of 0.5 nm to 10 nm;

a second process of exposing a surface of the p-AlGaN layer to gases for forming InGaN without InGaN being grown by stopping the supply of an Al source gas, introducing an In source gas, and increasing the supply of a Ga source gas while maintaining the p-AlGaN layer at a growth temperature; and wherein the first process and the second process are repeated to form the p cladding layer.

10. A method for producing a Group III nitride semiconductor light-emitting device according to claim 9, wherein the p-AlGaN layer has an Al composition ratio x of 15 mol % to 50 mol % when the p-AlGaN is defined as $p-Al_xGa_{1-x}N$.

11. A method for producing a Group III nitride semiconductor light-emitting device according to claim 9, wherein a growth temperature of the p-AlGaN layer is 800° C. to 950° C.

12. A method for producing a Group III nitride semiconductor light-emitting device according to claim 11, wherein the p-AlGaN layer has an Al composition ratio x of 15 mol % to 50 mol % when the p-AlGaN is defined as $p-Al_xGa_{1-x}N$.

* * * * *